United States Patent [19]
Rodal

[11] Patent Number: 5,764,172
[45] Date of Patent: Jun. 9, 1998

[54] HYBRID DAC SUITABLE FOR USE IN A GPS RECEIVER

[75] Inventor: Eric B. Rodal, Morgan Hill, Calif.

[73] Assignee: Trimble Navigation Limited, Sunnyvale, Calif.

[21] Appl. No.: 628,189

[22] Filed: Apr. 5, 1996

[51] Int. Cl.⁶ .................................................. H03M 1/66
[52] U.S. Cl. .................................. 341/145; 701/213
[58] Field of Search ................................ 341/145, 142, 341/118, 131, 144; 701/213

[56] References Cited

U.S. PATENT DOCUMENTS

| | | | |
|---|---|---|---|
| 4,998,108 | 3/1991 | Ginthner et al. | 341/148 |
| 5,440,313 | 8/1995 | Osterdock et al. | |

*Primary Examiner*—Brian K. Young
*Attorney, Agent, or Firm*—David R. Gildea

[57] ABSTRACT

An apparatus including a hybrid digital-to-analog converter (DAC) (10) for converting a combined digital word (23) into a combined analog output level (21) and a GPS receiver (36) for providing the combined digital word (23) and using the combined analog output level (21) for phase locking a voltage controlled oscillator (VCO) (40) to a GPS satellite signal (34). The combined digital word (23) includes a more significant (MS) digital word (13) having N bits and a less significant (LS) digital word (15) having M bits. The hybrid DAC (10) includes a pulse generator DAC (12) for converting the MS digital word (13) into pulse output signal having a duty cycle and an average MS analog level representative of the MS digital word (13) and a second DAC (14) for converting the LS digital word (15) into an average LS analog level representative of the LS digital word (15). The pulse generator DAC (12) uses a counting technique in order to obtain a high degree of precision. A filter/combiner (18) filters and combines the average MS and the LS analog levels into a combined analog output level (21) representative of the combined digital word (21) to control the VCO (40) for providing a GPS-derived frequency signal (41) and a VCO signal to a correlator (38). The correlator (38) provides the combined digital word (23) representative of a difference between the frequency of the VCO signal and the frequency of the GPS satellite signal (34).

28 Claims, 1 Drawing Sheet

HYBRID DAC SUITABLE FOR USE IN A GPS RECEIVER

BACKGROUND OF THE INVENTION

1. Field of the Invention

The invention relates generally to digital-to-analog converters (DACs) and more particularly to a digital-to-analog converter for use in a global positioning system (GPS) receiver providing GPS-derived time and frequency signals.

2. Description of the Prior Art

The global positioning system (GPS) is commonly used by GPS timing receivers for stabilizing the frequency of a locally generated signal and for generating GPS-derived time and frequency. The GPS-derived time signal typically has the form of pulse train having one pulse per second, each pulse coincident or having a known offset with the start of each second of GPS time. The GPS-derived frequency signal typically has a frequency of one, five, or ten megahertz. One application for the GPS-derived time and frequency signals is for calibrating an atomic clock. Previously, it was sometimes required to transport the atomic clock to the location of a time standard such as the National Bureau of Standards in Colorado in order to perform the calibration. Another application of the GPS-derived signals is for synchronizing TDMA and CDMA receivers in wireless and satellite systems. An important figure of merit for a GPS timing receiver is the incremental resolution of the time and frequency steps of the GPS-derived signals. A fine incremental resolution is necessary in order to minimize the difference between the time and frequency provided by the GPS-derived signals and the correct time and frequency.

Existing GPS timing receivers operate by downconverting the GPS satellite signal to a GPS intermediate frequency (IF) signal and then sampling the GPS IF signal with a clock signal. The sampled GPS IF signal is then correlated with an internally generated GPS replica signal to obtain correlation data. The time, repetition rate, and frequency of the GPS replica signal are derived from the clock signal and then adjusted by the correlation data to drive the GPS replica signal to correlate to the time, repetition rate, and frequency of the GPS IF signal. The GPS-derived time and frequency signals are then generated from the clock signal and information in the correlation data using one of several known techniques.

In one technique, the GPS-derived frequency and/or time signals are generated by frequency dividing the clock signal to the desired frequency and then delaying the divided signal in an analog delay line having several output taps. A digital signal representing the correlation data for the time difference between the GPS IF signal and the GPS replica signal then selects the output tap that minimizes the time difference. A fine incremental time resolution is obtained by having closely spaced output taps. This technique was used in a GPS receiver model "5000A Timer" that was commercially available from Trimble Navigation of Sunnyvale, Calif. beginning in 1983. However, a disadvantage of this technique is that a tapped analog delay line is required in order to obtain fine time resolution.

In another technique the GPS-derived time signal is obtained by frequency dividing the clock signal by a divide number that is fixed. The frequency divided signal is then digitally delayed in a circuit such as a shift register that is clocked by the clock signal. The incremental time resolution is determined by the period of the clock signal. A limitation of this technique is that a high frequency clock signal is required to obtain fine time resolution. Another limitation is that GPS receivers using this technique typically suffer from relatively poor jamming immunity and poor signal-to-noise ratio due to having a wide pre-detection information bandwidth corresponding to the high frequency clock signal. In another technique the GPS-derived time signal is obtained by frequency dividing the clock signal by a divide number that is dynamically adjusted according to the correlation data for the time difference between the GPS IF signal and the GPS replica signal. A disadvantage of this technique is that dynamically adjusting the divide number creates phase noise or jitter in the GPS-derived time signal.

Another technique used in existing GPS receivers includes a phase locked voltage controlled oscillator (VCO) for providing the clock signal. A digital signal representing the correlation data for the time or frequency difference between the GPS IF signal and the GPS replica signal is converted to an analog signal in a digital-to-analog converter (DAC) which is then used to drive the VCO to adjust the frequency of the clock signal so that the time, repetition rate, and frequency of the GPS replica signal matches the GPS IF signal. The clock signal may be frequency divided to get the desired frequency for the GPS-derived time and/or frequency signals. An example of such a GPS receiver is a model "4000S Surveyor" that was commercially available from Trimble Navigation beginning in 1987. Osterdock et al. in U.S. Pat. No. 5,440,313 discloses such a GPS receiver using a twenty-four bit DAC using pulse repetition rate modulation. An advantage of this technique is that the clock signal may provide the GPS-derived frequency directly. A limitation of this technique is that the frequency and time resolutions of the GPS-derived signals are limited by the resolution of the DAC. Typically, the DAC is required to be monotonic with a resolution of more than sixteen bits in order to achieve the frequency and/or time resolution that is desired. Unfortunately, existing DACs having more than sixteen bits of resolution are expensive and/or slow.

A pulse generator DAC using repetition rate modulation, such as the DAC described in Osterdock et al., or using pulse width modulation converts a digital input level to an analog output level by counting cycles of a clock signal, generating an output signal whose duty cycle and average analog level are a function of the digital input level, and filtering the output signal. Such DACs are inexpensive and very precise but are relatively slow and/or require a very high frequency for the clock signal. For example, a pulse generator DAC with twenty bits of resolution using a ten megahertz clock rate and a ten to one frequency filter passes information at less than one Hertz. For an information rate of one-hundred Hertz a clock rate on the order of one gigahertz would be required. Another type of DAC, sometimes called a binary summing DAC, uses resistor and/or amplifier ratios to convert the digital signal level to the analog signal level by summing outputs from a most significant bit (MSB) to a least significant bit (LSB) in ratios in a 1, 2, 4, 8, etc. sequence or in an R-2R ladder. Such binary summing DACs are fast but are expensive when more than sixteen bits of resolution is required due to the difficulty of guaranteeing the correct ratios. Binary summing DACs for twenty bits of resolution require a resistor ratio accuracy on the order of 0.0001%. There is a need for an inexpensive, relatively fast DAC having at least sixteen bits of resolution. There is a further need for a GPS receiver using such a DAC in a phase lock loop for stabilizing a GPS-derived frequency and/or time signal.

SUMMARY OF THE INVENTION

It is therefore an object of the present invention to provide an inexpensive, relatively fast hybrid digital-to-analog converter (DAC) for converting a digital word having at least sixteen bits to a representative analog output level.

Another object is to provide a GPS receiver apparatus using a hybrid DAC having at least sixteen bits of resolution for stabilizing a voltage controlled signal frequency to a frequency of a GPS satellite signal.

Briefly, in a preferred embodiment, an apparatus includes a hybrid digital-to-analog converter (DAC) for converting a combined digital word into a combined analog output level and a GPS receiver for providing the combined digital word and using the combined analog output level for phase locking a voltage controlled oscillator (VCO) to a GPS satellite signal. The combined digital word includes a more significant (MS) digital word having N bits and a less significant (LS) digital word having M bits. The hybrid DAC includes a pulse generator DAC for converting the MS digital word into pulse output signal having a duty cycle and an average MS analog level representative of the MS digital word and a second DAC for converting the LS digital word into an average LS analog level representative of the LS digital word. The pulse generator DAC uses a counting technique in order to obtain a high degree of precision. A filter/combiner filters and combines the average MS and the LS analog levels into a combined analog output level representative of the combined digital word to control the VCO for providing a GPS-derived frequency signal and a VCO signal to a correlator. The correlator provides the combined digital word representative of a difference between the frequency of the VCO signal and the frequency of the GPS satellite signal.

An advantage of the hybrid DAC of the present invention is that it provides at least sixteen bits of resolution in a low cost hybrid DAC having a relatively fast conversion rate.

Another advantage of the present invention is that it provides a GPS receiver using an inexpensive and relatively fast hybrid DAC having at least sixteen bits of frequency resolution for GPS-derived frequency and/or time signals.

These and other objects and advantages of the present invention will no doubt become obvious to those of ordinary skill in the art after having read the following detailed description of the preferred embodiments which are illustrated in the various figures.

IN THE DRAWINGS

FIG. 1 is a block diagram of a hybrid digital-to-analog converter (DAC) of the present invention; and FIG. 2 is a block diagram of a GPS receiver using the hybrid DAC of FIG. 1.

DETAILED DESCRIPTION OF THE PREFERRED EMBODIMENTS

Figure 1:
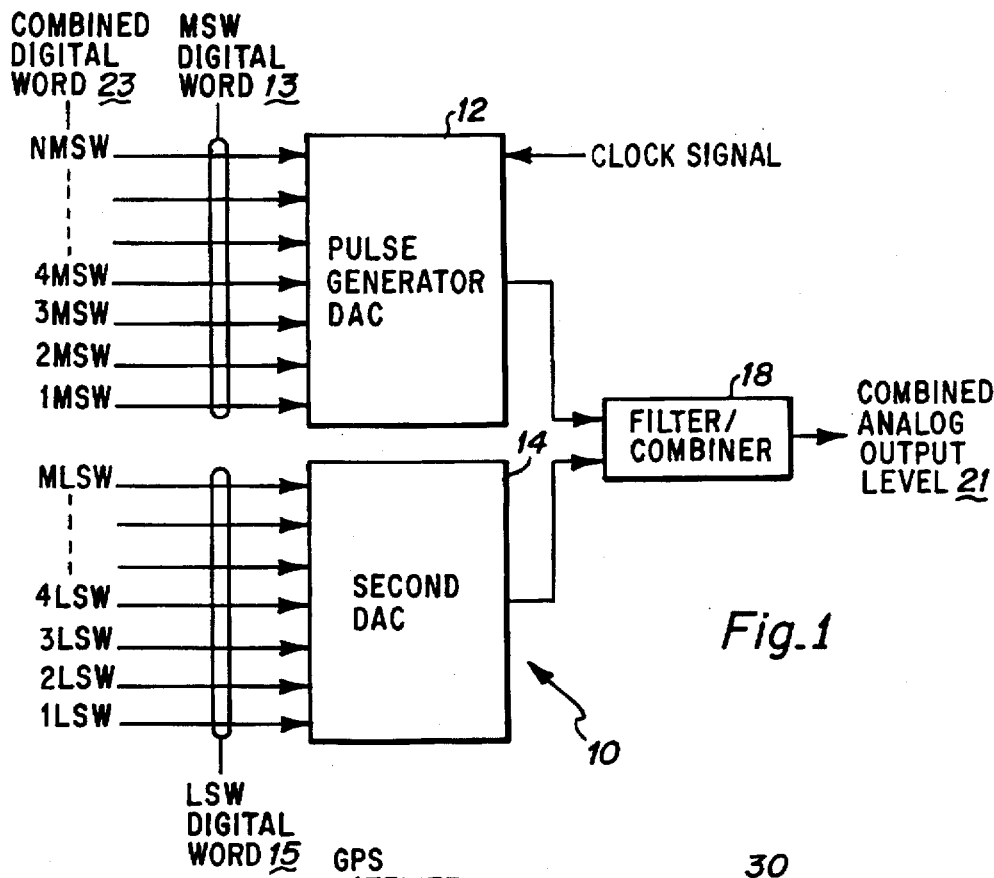

FIG. 1 illustrates a block diagram of a hybrid digital-to-analog converter (DAC) of the present invention referred to by the general reference number 10. The hybrid DAC 10 includes a pulse generator DAC 12 for receiving a more significant (MS) digital word 13 and a second DAC 14 for receiving a less significant (LS) digital word 15. The MS digital word 13 includes N bits of resolution designated $1_{msw}$ through $N_{msw}$ representing an MS digital level where $N_{msw}$ is the most significant bit and $1_{msw}$ is the least significant bit. Each successively more significant bit has two times the significance of the immediately preceding less significant bit starting with the $1_{msw}$ bit having a relative significance of one. The pulse generator DAC 12 receives a clock signal and generates a pulse output signal having a duty cycle having an average MS analog level that is precisely proportional to the MS digital word 13 by counting cycles of the clock signal. In a preferred embodiment, the pulse generator DAC 12 uses an electronic counter integrated circuit for modulating the pulse width of the pulses in the pulse output signal by setting the pulse output signal when the cycle count reaches the MS digital level and resetting the pulse output signal and the cycle count when the cycle count reaches $2^{(N-1)}$. Alternatively, the pulse generator DAC 12 uses a number controlled oscillator for modulating the repetition rate of a pulse having a fixed pulse width in the pulse output signal by generating the pulse and resetting the cycle count at a rate proportional to the MS digital level. The pulse output signal is passed to a filter/combiner 18. The filter/combiner 18 filters the pulse output signal and issues a relatively steady MS analog level that is proportional to the MS digital word 13. N may be selected over a range of at least one to twenty-four, however, the rate at which information is passed through the pulse generator DAC 12 and the filter/combiner 18 becomes slower or the frequency of the clock signal must be increased as N is increased. In a preferred embodiment N is ten or twelve and the frequency of the clock signal is ten megahertz. For N equal to ten, a clock rate of ten megahertz, and a filter/combiner 18 having a ten to one filter ratio, information can be passed at a rate on the order of one kilohertz.

The LS digital word 15 includes M bits of resolution designated $1_{lsw}$ through $M_{lsw}$ representing an LS digital level where $M_{lsw}$ is the most significant bit and $1_{lsw}$ is the least significant bit. Each successively more significant bit has two times the significance of the immediately preceding less significant bit starting with the $1_{lsw}$ bit having a relative significance of one. In a preferred embodiment, the second DAC 14 uses the counting technique as described above to convert the LS digital word 15 to an average LS analog level. Alternatively, the second DAC 14 is a binary summing DAC using attenuators and/or amplifiers to sum each successively more significant bit with a weighting ratio of two to one greater than the immediately less significant bit, the least significant bit having a relative weight of one. In one format, each successively more significant bit is summed through successively smaller resistors in a ratio of $2^{(M-1)}$ for the $1_{lsw}$ bit, $2^{(M-2)}$ for the $2_{lsw}$ bit, $2^{(M-3)}$ for the $3_{lsw}$ bit, $2^{(M-4)}$ for $4_{lsw}$ bit, and one for the $M_{lsw}$ bit. In another format an R-2R ladder is used to achieve the same result. Where the second DAC 14 is a binary summing DAC, M may be selected over a range of at least one to sixteen, however, such DACs become more expensive as M is increased beyond about twelve. In a preferred embodiment, M is ten or twelve. The second DAC 14 is not required to be as precise as the pulse generator DAC 12 because the digital word converted by the second DAC 14 is less significant than the digital word converted by the pulse generator DAC 12. Of course, the average MS and LS analog levels may be thought of as either a voltage or a current. Binary summing DACs suitable for the DAC 14 are readily available from several companies such as Analog Devices Corp. in any industrial city.

The filter/combiner 18 uses resistors, capacitors, and/or other electronic circuitry to combine the average MS analog level and the average LS analog level so that the combined analog output level 21 is representative of a combined digital word 23. In order to combine the average LS and MS analog signal levels with the correct significant, the filter/combiner 18 scales a full scale value of the MS analog level to $[2^{(N+M)}-2^M]$ relative to a full scale value of the LS analog level of $[2^M-1]$ and then sums the scaled LS and MS analog signal levels. For example, when N and M are each ten bits, the LS analog level has the full scale value of 1023, the MS analog level has the full scale value of U.S. Pat. No. 1,047,552, and the combined analog output level 21 has a full scale value of U.S. Pat. No. 1,048,575. The combined analog output level 21 is representative of the combined digital word 23 having N plus M bits of a combined digital level where $1_{lsw}$ is the least significant bit and $N_{msw}$ is the most significant bit. In a preferred embodiment, the filter/combiner 18 includes a first resistor for passing the average MS analog level to a first node of a capacitor having a second node connected to ground and a second resistor for passing the average LS analog level to the first node of the capacitor. The combined analog output level 21 is taken from the first node of the capacitor. The second resistor has resistance of about $2^M$ times the resistance of the first resistor. When N and M each are ten bits, the second resistor has a resistance of 1024 times the resistance of the first resistor and the first resistor must have an accuracy better than about 0.1% to insure that the hybrid DAC 10 is monotonic.

Figure 2:
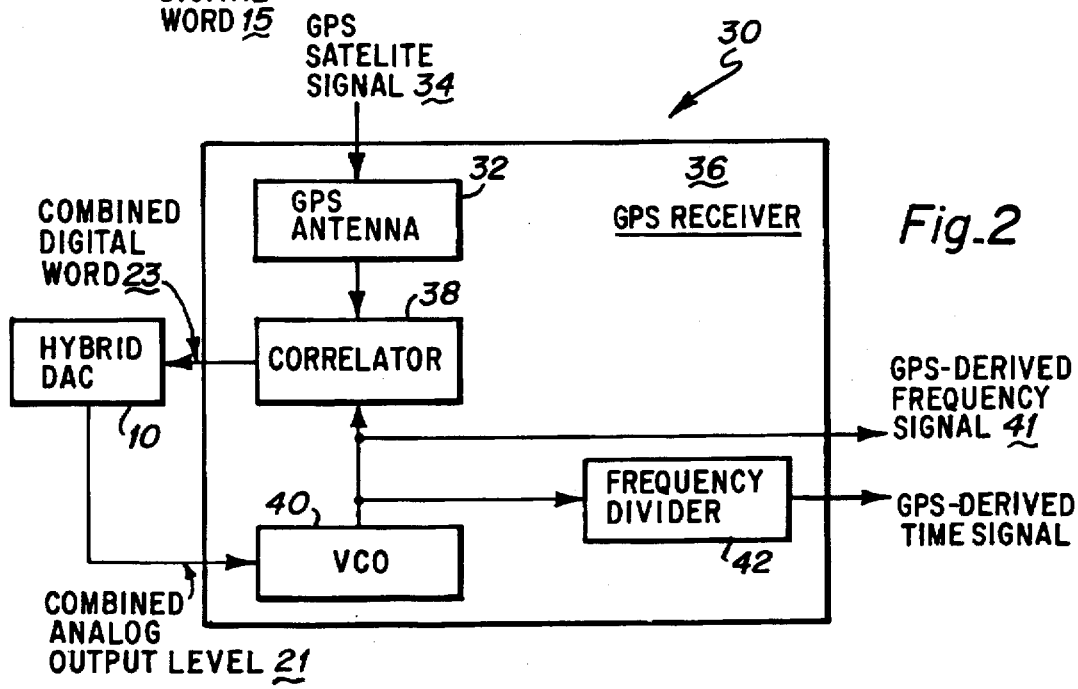

FIG. 2 illustrates a block diagram of apparatus of the present invention referred to by the general reference number 30 and including the hybrid DAC 10 and a GPS receiver 36. The GPS receiver 36 includes a GPS antenna 32 for receiving a GPS satellite signal 34 from a GPS satellite and issuing a responsive conducted GPS signal, a correlator 38 for receiving the conducted GPS signal, and a voltage controlled oscillator (VCO) 40 for providing VCO signal having a VCO signal frequency to the correlator 38. The correlator 38 may include a downconverter for downconverting the conducted GPS signal to a GPS intermediate frequency (IF) signal representative of the GPS signal. The correlator 38 generates a GPS replica signal having a replica frequency based upon the VCO signal frequency and provides a digital correlation signal including information for a frequency error based upon a difference between the VCO signal frequency and the frequency of the GPS satellite signal 34. The information for the frequency error is included in the combined digital word 23 described in the detailed description accompanying FIG. 1. The hybrid DAC 10 converts the combined digital word 23 into the combined analog output level 21. The VCO 40 adjusts the VCO signal frequency according to the combined analog output level 21. One or more integrators and/or low frequency poles may be included in software and/or hardware in the correlator 38 for processing the digital correlation signal, thereby providing a second or higher order phase lock loop for stabilizing the VCO signal frequency. In order to make the phase lock loop stable, one or more zeroes are also included. The VCO signal is split and one part is issued as an output for a GPS-derived frequency signal 41. Optionally, frequency multipliers or dividers may be used to select a nominal frequency of the GPS-derived frequency signal. In a preferred embodiment, the nominal frequency of the VCO 40 is ten megahertz.

An optional frequency divider 42 divides and/or multiplies the VCO signal frequency to provide one or more desired output frequencies for a GPS-derived time signal. In a preferred embodiment, the frequency divider 42 divides the VCO signal frequency to provide a GPS-derived time signal of one pulse per second (1 PPS). Optionally, the correlator 38 includes circuitry for synchronizing 1 PPS GPS-derived time signal to GPS time.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A hybrid digital-to-analog converter (DAC), comprising:

a pulse generator DAC for receiving a more significant (MS) digital word having an MS digital level and converting said MS digital word into an MS pulse output signal having an average MS analog level representative of said MS digital level;

a second DAC for receiving a less significant (LS) digital word having an LS digital level and converting said LS digital word into an average LS analog level representative of said LS digital level; and a filter/combiner coupled to the pulse generator DAC and the second DAC for filtering said MS pulse output signal for providing said average MS analog level and for combining said average MS analog level and said average LS analog level for providing a combined analog output level representative of a combined digital level of a combined digital word including said MS digital word and said LS digital word.

2. A hybrid digital-to-analog converter (DAC), comprising:

a pulse generator DAC for receiving a more significant (MS) digital word having an MS digital level and converting said MS digital word into an MS pulse output signal having an average MS analog level representative of said MS digital level;

a second DAC for receiving a less significant (LS) digital word having an LS digital level and for converting said LS digital word into an LS pulse output signal having said average LS analog level representative of said LS digital level; and a filter/combiner coupled to the pulse generator DAC and the second DAC for combining said average MS analog level and said average LS analog level for providing a combined analog output level representative of a combined digital level of a combined digital word including said MS digital word and said LS digital word, the filter/combiner including a filter for filtering said LS pulse output signal.

3. A hybrid digital-to-analog converter (DAC), comprising:

a pulse generator DAC for receiving a more significant (MS) digital word having an MS digital level and converting said MS digital word into an MS pulse output signal having an average MS analog level representative of said MS digital level;

a second DAC including a binary summing DAC for receiving a less significant (LS) digital word having an LS digital level and for summing each successively more significant bit of said LS digital level with a weighting ratio of two to one more than the immediately less significant bit for converting said LS digital word to said average LS analog level; and a filter/combiner coupled to the pulse generator DAC and the second DAC for combining said average MS analog level and said average LS analog level for providing a combined analog output level representative of a combined digital level of a combined digital word including said MS digital word and said LS digital word.

4. A hybrid digital-to-analog converter (DAC), comprising:
- a pulse generator DAC for receiving a more significant (MS) digital word having an MS digital level including N bits and for converting said MS digital word into an MS pulse output signal having an average MS analog level representative of said MS digital level by receiving a clock signal, counting cycles of said clock signal, setting said MS pulse output signal when a cycle count of said clock signal reaches said MS digital level and resetting said MS pulse output signal and said cycle count when said cycle count reaches $2^{(N-1)}$;
- a second DAC for receiving a less significant (LS) digital word having an LS digital level and converting said LS digital word into an average LS analog level representative of said LS digital level; and
- a filter/combiner coupled to the pulse generator DAC and second DAC for combining said average MS analog level and said average LS analog level for providing a combined analog output level representative of a combined digital level of a combined digital word including said MS digital word and said LS digital word.

5. A hybrid digital-to-analog converter (DAC), comprising:
- a pulse generator DAC for receiving a more significant (MS) digital word having an MS digital level including N bits and for converting said MS digital word into an MS pulse output signal having an average MS analog level representative of said MS digital level by receiving a clock signal, counting cycles of said clock signal, and issuing an MS pulse output signal at a rate proportional to said MS digital level;
- a second DAC for receiving a less significant (LS) digital word having an LS digital level and converting said LS digital word into an average LS analog level representative of said LS digital level; and
- a filter/combiner coupled to the pulse generator DAC and the second DAC for combining said average MS analog level and said average LS analog level for providing a combined analog output level representative of a combined digital level of a combined digital word including said MS digital word and said LS digital word.

6. The hybrid DAC of claim 1, wherein:
said MS digital word includes N bits;
said LS digital word includes M bits; and
said N plus said M is at least sixteen.

7. The hybrid DAC of claim 1, wherein:
said LS digital word includes M bits; and
the filter/combiner includes a first resistor having a first node coupled to receive said MS pulse output signal and a second node coupled to a node of a capacitor; a second resistor having a first node coupled to receive said average LS analog level and a second node coupled to said node of said capacitor, said second resistor having a resistance of about $2^M$ times a resistance of said first resistor; and said node of said capacitor providing said combined analog output level.

8. An apparatus for receiving a GPS satellite signal and providing a GPS-derived frequency signal, comprising:
a hybrid digital-to-analog converter (DAC) comprising:
- a pulse generator DAC for receiving a more significant (MS) digital word having an MS digital level and converting said MS digital word into an MS pulse output signal having an average MS analog level representative of said MS digital level;
- a second DAC for receiving a less significant (LS) digital word having an LS digital level and converting said LS digital word into an average LS analog level representative of said LS digital level; and
- a filter/combiner coupled to the pulse generator DAC and the second DAC (14) for combining said average MS analog level and said average LS analog level for providing a combined analog output level representative of a combined digital level of a combined digital word including said MS digital word and said LS digital word; and a GPS receiver, connected to the hybrid DAC, including a GPS antenna for receiving a GPS satellite signal from a GPS satellite, a voltage controlled oscillator (VCO) for using said combined analog output level for controlling a frequency of a GPS-derived frequency signal, and a correlator for providing said combined digital word representative of a frequency error between said GPS satellite signal and said GPS-derived frequency signal (41), whereby the frequency of said GPS-derived frequency signal is stabilized by said GPS satellite signal.

9. The apparatus of claim 8, wherein:
the filter/combiner is further for filtering said MS pulse output signal for providing said average MS analog level.

10. The apparatus of claim 8, wherein:
the second DAC is for converting said LS digital word into an LS pulse output signal having said average LS analog level; and the filter/combiner includes a filter for filtering said LS pulse output signal.

11. The apparatus of claim 8, wherein:
the second DAC includes a binary summing DAC for summing each successively more significant bit of said LS digital level with a weighting ratio of two to one more than the immediately less significant bit for converting said LS digital word to said average LS analog level.

12. The apparatus of claim 8, wherein:
said MS digital word includes N bits; and
the pulse generator DAC is for receiving a clock signal, counting cycles of said clock signal, setting said MS pulse output signal when a cycle count of said clock signal reaches said MS digital level and resetting said MS pulse output signal and said cycle count when said cycle count reaches $2^{(N-1)}$.

13. The apparatus of claim 8, wherein:
said MS digital word includes N bits; and
the pulse generator DAC is for receiving a clock signal, counting cycles of said clock signal, and issuing an MS pulse output signal a at rate proportional to said MS digital level.

14. The apparatus of claim 8, wherein:
said MS digital word includes N bits;
said LS digital word includes M bits; and
said N plus said M is at least sixteen.

15. The apparatus of claim 8, wherein:
said LS digital word includes M bits; and
the filter/combiner includes a first resistor having a first node coupled to receive said MS pulse output signal and a second node coupled to a node of a capacitor; a second resistor having a first node coupled to receive said average LS analog level and a second node coupled to said node of said capacitor, said second resistor having a resistance of about $2^M$ times a resistance of said first resistor; and said node of said capacitor providing said combined analog output level.

16. A method in a hybrid digital-to-analog converter (DAC) for converting a combined digital word into a combined analog output level, comprising steps of:
splitting said combined digital word into a more significant (MS) digital word having an MS digital level for the more significant bits of said combined digital word and a less significant (LS) digital word having an LS digital level for the less significant bits of said combined digital word;

converting said MS digital word into an MS pulse output signal having an average MS analog level representative of said MS digital level;

converting said LS digital word into an average LS analog level representative of said LS digital level by summing each successively more significant bit of said LS digital level with a weighting ratio of two to one greater than the immediately less significant bit; and combining said average MS analog level and said average LS analog level for providing said combined analog output level.

17. A method in a hybrid digital-to-analog converter (DAC) for converting a combined digital word into a combined analog output level, comprising steps of:

splitting said combined digital word into a more significant (MS) digital word including N bits having an MS digital level for the more significant bits of said combined digital word and a less significant (LS) digital word having an LS digital level for the less significant bits of said combined digital word;

converting said MS digital word into an MS pulse output signal having an average MS analog level representative of said MS digital level by steps of counting cycles of a clock signal; setting said MS pulse output signal when a cycle count of said clock signal reaches said MS digital level; and resetting said MS pulse output signal and said cycle count when said cycle count reaches $2^{(N-1)}$;

converting said LS digital word into an average LS analog level representative of said LS digital level;

combining said average MS analog level and said average LS analog level for providing said combined analog output level.

18. The method of claim 16, wherein:

said MS digital word includes N bits; and the step of converting said MS digital word includes steps of counting cycles of a clock signal; issuing an MS pulse output signal at a rate proportional to said MS digital level.

19. The method of claim 16, wherein:

said MS digital word includes N bits;

said LS digital word includes M bits; and said N plus said M is at least sixteen.

20. A method in a hybrid digital-to-analog converter (DAC) for converting a combined digital word into a combined analog output level, comprising steps of:

splitting said combined digital word into a more significant (MS) digital word having an MS digital level for the more significant bits of said combined digital word and a less significant (LS) digital word including M bits having an LS digital level for the less significant bits of said combined digital word;

converting said MS digital word into an MS pulse output signal having an average MS analog level representative of said MS digital level;

converting said LS digital word into an average LS analog level representative of said LS digital level; and combining said average MS analog level and said average LS analog level by steps of coupling said average MS analog level through a first resistor to a node of a capacitor; coupling said average LS analog level through a second resistor to said node of said capacitor, said second resistor having a resistance of $2^M$ times a resistance; and providing said combined analog output level (21) from said node of said capacitor.

21. The method of claim 17, further including a step of:

filtering said MS pulse output signal for providing said average MS analog level.

22. The method of claim 17, further including steps of:

converting said LS digital word into an LS pulse output signal; and filtering said LS pulse output signal for providing said average LS analog level.

23. A method for providing a GPS-derived frequency signal, comprising steps of:

receiving a GPS satellite signal from a GPS satellite;

correlating said GPS satellite signal and said GPS-derived frequency signal for providing a combined digital word representative of a frequency error between said GPS satellite signal and said GPS-derived frequency signal, said combined digital word including a more significant (MS) digital word having an MS digital level for the more significant bits of said combined digital word and a less significant (LS) digital word having an LS digital level for the less significant bits of said combined digital word;

converting said MS digital word into an MS pulse output signal having an average MS analog level representative of said MS digital level;

converting said LS digital word into an average LS analog level representative of said LS digital level;

combining said average MS analog level and said average LS analog level for providing said combined analog output level representative of said combined digital word;

controlling a frequency of said GPS-derived frequency signal with said combined analog output level.

24. The method of claim 23, further including a step of:

filtering said MS pulse output signal for providing said average MS analog level.

25. The method of claim 23, further including steps of:

converting said LS digital word into an LS pulse output signal; and filtering said LS pulse output signal for providing said average LS analog level.

26. The method of claim 23, wherein:

the step of converting said LS digital word includes summing each successively more significant bit of said LS digital level with a weighting ratio of two to one greater than the immediately less significant bit.

27. The method of claim 23, wherein:

said MS digital word includes N bits; and the step of converting said MS digital word includes steps of counting cycles of a clock signal; setting said MS pulse output signal when a cycle count of said clock signal reaches said MS digital level; and resetting said MS pulse output signal and said cycle count when said cycle count reaches $2^{(N-1)}$.

28. The method of claim 23, wherein:

said MS digital word includes N bits; and the step of converting said MS digital word includes steps of counting cycles of a clock signal; and issuing an MS pulse output signal at a rate proportional to said MS digital level.

* * * * *